April 20, 1971 G. J. GILBERT 3,575,742

METHOD OF MAKING A SEMICONDUCTOR DEVICE

Original Filed Nov. 9, 1964

INVENTOR.
GEORGE J. GILBERT
BY
Bernard Malina
ATTORNEY

United States Patent Office 3,575,742

Patented Apr. 20, 1971

3,575,742

METHOD OF MAKING A SEMICONDUCTOR DEVICE

George J. Gilbert, Whitehouse Station, N.J., assignor to Solitron Devices, Inc.

Original application Nov. 9, 1964, Ser. No. 409,702, now Patent No. 3,484,309, dated Dec. 16, 1969. Divided and this application July 22, 1969, Ser. No. 862,112

Int. Cl. H01l 7/36, 7/44

U.S. Cl. 148—187 6 Claims

ABSTRACT OF THE DISCLOSURE

A semiconductor device is produced by depositing a p-type doped oxide onto the masked surface of an n-type semiconductor substrate, prediffusing the p-type impurity into the surface of the substrate, removing the center portion of the oxide and further diffusing the p-type dopant from the oxide into the substrate. To form a transistor, an emitter region is diffused into the substrate through the aforementioned center portion.

Figure 1:
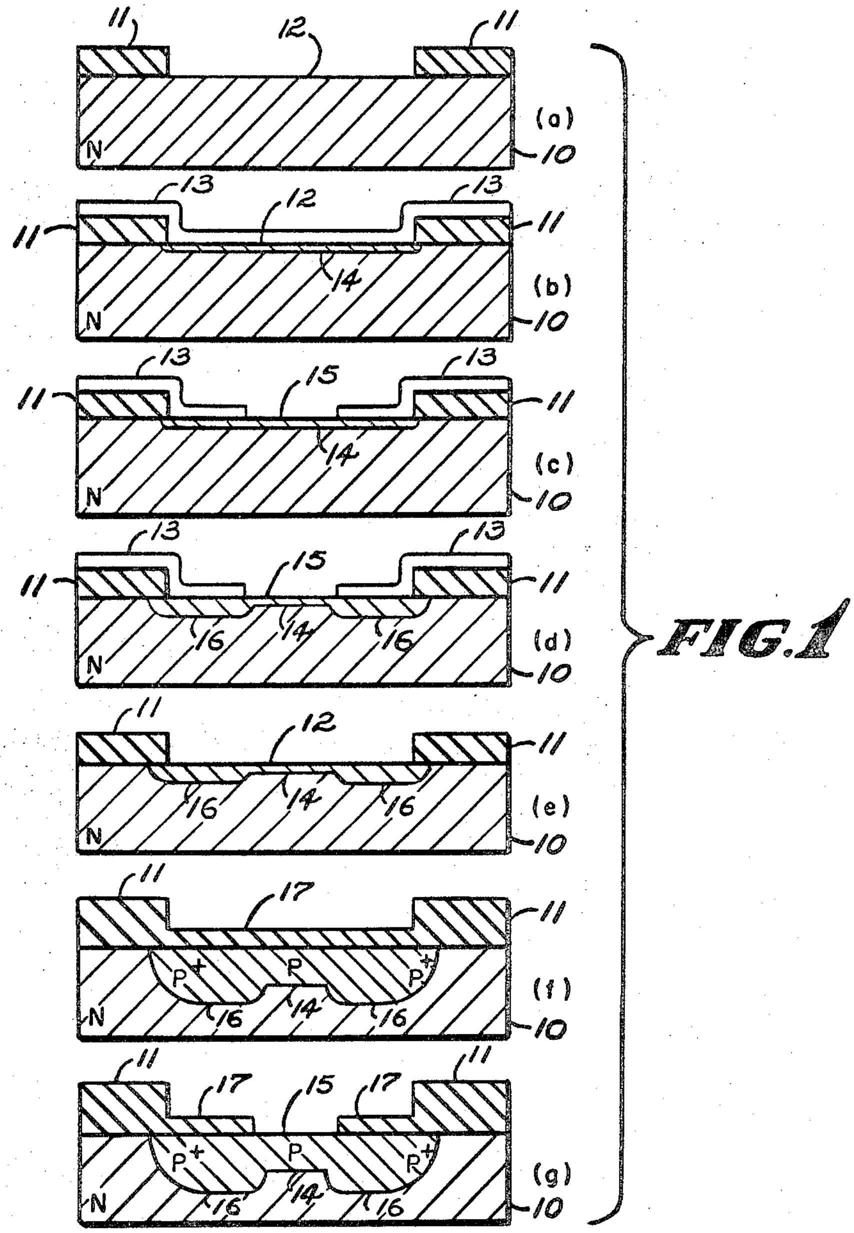

This application is a division of application Ser. No. 409,702, filed Nov. 9, 1964, now U.S. Pat. No. 3,484,309.

The present invention relates to a semiconductor device and method, and, more particularly, to an improved transistor with a low base resistance and a method of making the same.

In this specification, the terms "nonplanar" and "substantially planar" are used in connection with semiconductor P-N junctions. When so used, they refer to the major portion of the junction which lies generally parallel to the upper surface of a semiconductive wafer. The vertical portion of the junction at its outer periphery is ignored when referring to the junction as a whole as either "substantially planar" or "nonplanar." According to the above definition, a substantially planar P-N junction is one in which the entire junction interface, except the vertical periphery, lies in a single plane. The term "relatively low resistivity" is used in this specification to denote a doping level of the order of $10^{20}$ impurity atoms per cubic centimeter, whereas normal resistivity denotes a doping level of the order of $10^{18}$ impurity atoms per cubic centimeter.

The present invention provides a semiconductor device having a nonplanar P-N junction. A diffused region adjacent the junction has a lower resistivity at its lateral periphery than at its laterally central portion. The nonplanar P-N junction is formed by removing oxide from a portion of the surface of a first conductivity type oxided semiconductive wafer, depositing a coating containing opposite conductivity type impurity atoms on the exposed surface, diffusing a controlled number of the impurity atoms into the exposed wafer surface, etching away a portion of the coating to re-expose a central area of the surface, and diffusing additional impurity atoms into the unexposed wafer surface from the remaining coating. This junction may serve as a diode junction or as the collector-base junction for a transistor. The diffused emitter of such a transistor is positioned to immediately overlie the higher resistivity central portion of the base.

The method of the present invention results in a novel improved transistor exhibiting several advantages. First, the nonplanar interior region of the collector-base junction causes injection from the emitter to spread toward the center of the emitter because of a varying base width and a lower carrier concentration at the lateral center of the base. Second, the low resistivity peripheral portion of the base provides a device having a lower base resistance than prior art devices. Third, the current gain of the improved transistor peaks at higher currents since some injection occurs near the center of the emitter. Fourth, the current gain is higher at higher current levels than for prior art devices. Fifth, the improved device has a low base to emitter saturation voltage. Sixth, the device shows a higher secondary breakdown voltage than prior art devices.

Figure 2:
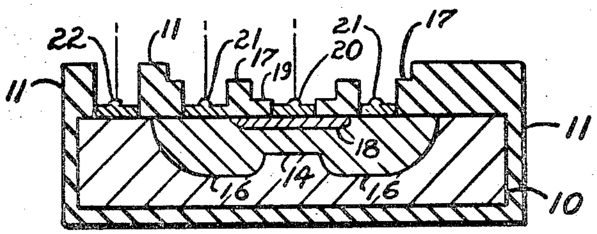

The present invention may be more fully understood when taken in connection with the following detailed description and drawings, wherein:

FIGS. 1(*a*)–(*g*) diagrammatically illustrate, in cross section, several steps in the production of devices containing a nonplanar P-N junction; and FIG. 2 is a cross-sectional view of a transistor utilizing a nonplanar collector-base junction.

In the figures, the relative depth of the diffused regions has been greatly exaggerated for clarity. FIGS. 1(*a*)–(*d*) diagrammatically represent a wafer or block 10 of semiconductive material at various stages during the process of forming a nonplanar P-N junction. A wafer 10 of N type semiconductive material, which may be germanium or silicon, for example, is heated in an oxidizing atmosphere to grow an oxide coating 11 on the surface. Only the oxide on the upper surface has been shown for clarity. Photo etching techniques are used to remove a portion of oxide 11 to expose a surface area 12 of a region of wafer 10 as shown in FIG. 1(*a*). A coating containing P type impurity atoms is then deposited on surface area 12 as shown in FIG. 1(*b*). The coating deposition is in accordance with techniques which are readily apparent to those skilled in the art. Either during deposition of coating 13, or immediately thereafter, wafer 10 is heated to a temperature sufficient to cause impurity atoms to diffuse shallowly into surface area 12 to form a limited P type source region 14. As shown in FIG. 1(*c*), after formation of limited source 14, a portion of coating 13 is removed by selective photo etching to re-expose a reduced area 15 of the wafer surface. When the method is used for producing transistors, area 15 preferably has the same size, configuration, and position, as the exposed area for an emitter diffusion will occupy on a subsequent step. Additional P type impurity atoms are then diffused into the unexposed remainder of surface area 12 to form peripheral low resistivity P type source portion 16. Because of the additional P type impurity atoms present in peripheral portion 16, it extends deeper into wafer 10 than the remainder of region 14. The increase in impurity concentration at the surface of portion 16, by the addition of P type impurity atoms from unremoved coating 13, causes their diffusion rate to increase in portion 16 and accounts for the greater depth of portion 16. At this time during processing, a nonplanar P-N junction has been formed in wafer 10.

FIGS. 1(*e*)–(*g*) diagrammatically illustrate additional steps utilized in the production of transistors having a nonplanar collector-base junction. The remainder of coating 13 is removed by selective etching techniques known to those skilled in the art as shown in FIG. 1(*e*). FIG. 1(*f*) shows wafer 10 after a deep diffusion and reoxidation step has been carried out. The wafer is heated to cause the P type impurities in regions 14 and 16 to diffuse deeper moving the P–N junction farther from the upper surface of wafer 10. Either simultaneously, or immediately thereafter, exposed area 12 is reoxided with oxide layer 17. After reoxidation, an emitter pattern, substantially coextensive in area with the area of the pattern formed in the step illustrated in FIG. 1(*c*), is etched through reformed oxide 17 to re-expose area 15 as shown in FIG. 1(*g*). After re-exposing area 15, a transistor is formed utilizing techniques readily apparent to those skilled in the art. For example, sufficient N type impurity atoms may be diffused into wafer 10 through area 15 to form a relatively low resistivity emitter region. Area 15 may then be reoxidized either simultaneously with the diffusion, or after it. Holes may then be etched in the oxide to provide for ohmic contacts to the base, emitter, and collector. After this etching step, ohmic contacts may be deposited.

FIG. 2 is a cross-sectional view of one modification of a transistor utilizing a nonplanar collector-base junction. An N type semiconductive block 10 forms the collector. A low resistivity laterally peripheral portion 16 of a P type base region surrounds an active central base portion 14. Preferably, a relatively low resistivity N type emitter 18 lies adjacent the upper surface of wafer 10 and immediately overlies portion 14. Emitter 18 need not have a relatively low resistivity and may have a lateral extent either slightly less than, exactly equal to, or slightly greater than the lateral extent of the higher resistivity portion 14 of the base. The exact surface pattern of region 14 and emitter 18 is a matter of choice and may be adapted to fit the use to which the transistor will be put. For example, the areas may be generally circular or generally rectangular with finger-like extensions. The surface of wafer 10 is covered by original oxide layer 11, a first regrown oxide layer 17, and a second regrown oxide layer 19. Ohmic contacts 20, 21, and 22, which may be of aluminum or any other suitable material, are made to the emitter, base, and collector regions respectively. As an alternate form, collector contact 22 may be connected on the lower surface of wafer 10, after removing oxide 11, rather than through the hole shown on the upper surface. Elements of Groups III and V of the Periodic Table of elements provide, respectively, suitable P and N type impurity atoms for use in producing such transistors.

Transistors utilizing the present invention are useful in high frequency applications because of the reduced base resistance. Such transistors also have a peak current gain at higher levels than prior art transistors because of the varying base resistivity and varying base width.

EXAMPLE

The following example illustrates the preparation of a transistor according to the present invention. A single crystal chip of N type silicon was heated in an oxidizing atmosphere at a temperature of approximately 1200° C. for approximately two hours to form a silicon dioxide coating on the wafer surface. The wafer was cooled, masked with photo resist, and etched to cut away a portion of the oxide in the base pattern. The wafer was then heated to a temperature of approximately 900° C. in an atmosphere containing boron and oxygen. This resulted in creation of a borosilicate glass on the surface of the silicon dioxide and the exposed wafer. During this time, a number of boron atoms shallowly diffused into the exposed wafer surface. The wafer was then cooled, masked with photoresist, and etched in the emitter pattern to re-expose a portion of the wafer surface while leaving the borosilicate glass in contact with surrounding portions. The wafer was then reheated in an inert atmosphere to a temperature sufficient to cause diffusion of additional boron atoms into the wafer in the area still covered by the borosilicate glass. Next, the wafer was cooled and the remaining borosilicate glass was removed by selective etching. After that, the wafer was heated to a temperature of 1200° C. in an oxidizing atmosphere to cause the collector-base junction to diffuse more deeply into the wafer and to reoxidize the re-exposed wafer surface. The wafer was then cooled, remasked with the emitter pattern, and photo etched to again re-expose the wafer surface in the emitter pattern. Next, the wafer was heated to a temperature of about 950° C. in an atmosphere containing phosphorous and oxygen to form a phosphorosilicate glass over the exposed wafer surface. The temperature was then raised to approximately 1150° C. and the phosphorous supply shut off. The phosphorous diffusion was carried out at the above temperature for sufficient time to yield the desired emitter-base junction depth. Finally, ohmic contacts were made to the transistor in the normal manner.

Though the method and device of the present invention have been described in terms of a preferred embodiment, many modifications will be readily apparent to those skilled in the art. For example, the starting wafer may be of P type rather than N type, and the resulting transistor may be a PNP device rather than the NPN structure illustrated. Additionally, the transistor may be one of a number of transistors produced on a single chip for an integrated circuit; therefore, a single transistor need not utilize the parent material of the block as the collector. The collector may, instead, be a region diffused into, or epitaxially grown on, a block of opposite conductivity type material. It should be understood that the scope of this invention is limited only by the scope of the appended claims:

I claim:

1. A method of producing an improved transistor with a low base resistance comprising:
(1) forming an oxide on the surface of a block of semiconductive material of a first conductivity type;
(2) selectively removing oxide to expose the surface of a region in the block;
(3) depositing a coating containing opposite conductivity type impurity atoms on the region surface;
(4) diffusing a controlled number of the opposite conductivity type atoms into the region to form a limited source;
(5) selectively removing coating from a portion of the region surface, the portion comprising less than all of the region surface;
(6) diffusing additional opposite conductivity type atoms from the coating into the unexposed remainder of the region surface to form a nonplanar P-N junction in the wafer;
(7) removing the remainder of the coating from the wafer;
(8) diffusing the opposite conductivity type atoms more deeply into the wafer in an oxidizing atmosphere to reform an oxide on the region surface and to position the nonplanar junction within the water;
(9) selectively removing reformed oxide from an area substantially coextensive with the region surface portion to re-expose the portion; and
(10) forming a substantially planar diffused P-N junction through the re-exposed portion.

2. In the method of claim 1, the additional step of reforming an oxide on the re-exposed portion.

3. A method of producing an improved transistor with a low base resistance comprising:
(1) forming an oxide on the surface of a wafer of semiconductive material having a first region of one conductivity type therein;
(2) selectively removing oxide to expose a second region surface, the second region comprising a portion of the first region;
(3) depositing a coating containing opposite conductivity type impurity atoms on the second region surface;
(4) diffusing a controlled number of the opposite conductivity type atoms into the second region to form a limited opposite conductivity type source;
(5) selectively removing coating from a portion of the second region surface, the portion comprising less than all of the second region surface;
(6) diffusing additional opposite conductivity type atoms from the coating into the unexposed remainder of the second region surface to form a nonplanar P-N junction in the wafer;
(7) reforming an oxide on the second region surface;
(8) selectively removing reformed oxide from an area substantially coextensive with the second region surface portion to re-expose the portion; and (9) forming a substantially planar diffused P-N junction in the wafer through the re-exposed portion.

4. A method of producing an improved transistor with a low base resistance comprising:

(1) forming an oxide on the surface of the wafer of semiconductive material having a first region of one conductivity type therein;

(2) selectively removing oxide to expose a second region surface, the second region comprising a portion of the first region;

(3) depositing a coating containing opposite conductivity type impurity atoms on the second region surface;

(4) diffusing a controlled number of the opposite conductivity type atoms into the second region to form a limited source;

(5) selectively removing the coating from a portion of the second region surface, the portion comprising less than all of the second region surface;

(6) diffusing additional opposite conductivity type atoms from the coating into the unexposed remainder of the second region surface to form a nonplanar P-N junction in the wafer;

(7) reforming an oxide on the second region surface;

(8) selectively removing reformed oxide from an area substantially coextensive with the second region surface portion to re-expose the portion;

(9) diffusing first conductivity type impurity atoms into the re-exposed portion to form a substantially planar P-N junction; and

(10) reoxidizing the re-exposed portion.

5. A method of forming a nonplanar P-N junction and a diffused region of varying lateral resistivity in a semiconductor comprising:

forming an oxide on the surface of a wafer of semiconductive material of a first conductivity type;

selectively removing oxide to expose a region of the wafer surface;

depositing a coating containing impurity atoms of opposite conductivity type on the region;

diffusing a controlled number of the impurity atoms into the region to form a limited impurity source;

selectively removing a portion of the coating to expose less than all of the region; and diffusing additional impurity atoms from the remaining coating into the unexposed remainder of the region.

6. A method of forming a nonplanar semiconductor P-N junction and an adjacent diffused region of varying lateral resistivity, comprising:

forming an oxide on the surface of wafer of semiconductive material having a first conductivity type region therein;

selectively removing oxide to expose a surface portion of the region;

depositing a coating containing opposite conductivity type impurity atoms on the surface portion;

diffusing a controlled number of the atoms into the region to form a limited impurity source;

selectively removing coating to expose less than all of the surface portion; and diffusing additional impurity atoms from the remaining coating into the unexposed surface portion.

References Cited

UNITED STATES PATENTS 3,305,913 2/1967 Loro -------------- 148—186

L. DEWAYNE RUTLEDGE, Primary Examiner

R. A. LESTER, Assistant Examiner

U.S. Cl. X.R.

29—578; 148—188